United States Patent [19]
Lin et al.

[11] Patent Number: 6,005,426
[45] Date of Patent: Dec. 21, 1999

[54] DIGITAL-TYPE DELAY LOCKED LOOP WITH EXPANDED INPUT LOCKING RANGE

[75] Inventors: Jyhfong Lin; Hsin-Chieh Lin, both of Taipei, Taiwan

[73] Assignee: VIA Technologies, Inc., Taipei, Taiwan

[21] Appl. No.: 09/073,746

[22] Filed: May 6, 1998

[51] Int. Cl.$^6$ ........................................ H03L 7/06
[52] U.S. Cl. ........................ 327/158; 327/155; 327/161
[58] Field of Search .................... 327/155, 156, 327/158, 161, 175, 276, 269, 261; 375/376

[56] References Cited

U.S. PATENT DOCUMENTS

| | | | |
|---|---|---|---|
| 4,817,199 | 3/1989 | Wallraff | 455/260 |
| 5,479,458 | 12/1995 | Tanaka | 375/376 |
| 5,572,557 | 11/1996 | Aoki | 375/376 |

*Primary Examiner*—Toan Tran
*Assistant Examiner*—Quan Tra
*Attorney, Agent, or Firm*—Alston & Bird LLP

[57] ABSTRACT

A low-jitter delay locked loop having an expanded phase locking range without the necessity of setting the initial delay is provided. The loop is to be supplied by a system clock and includes a pulse generator receiving the system clock for generating a first pulse signal and a second pulse signal in response to a triggering signal, a delay device receiving the system clock for providing a delayed clock in response to a control signal, a frequency-reducing device for frequency-reducing the system clock into a first clock in response to the first pulse signal and frequency-reducing the delayed clock into a second clock in response to the second pulse signal, and a comparator for comparing the first and second clocks to generate the control signal.

25 Claims, 5 Drawing Sheets

DIGITAL-TYPE DELAY LOCKED LOOP WITH EXPANDED INPUT LOCKING RANGE

FIELD OF THE INVENTION

The present invention relates to a delay locked loop, and more particularly to a diversified application thereof.

BACKGROUND OF THE INVENTION

The general delay locked loop, as shown in FIG. 1A includes a clock generator 101 generating a system clock 105, a delay array 102 receiving system clock 105 for providing a delayed clock 106, a phase detector 103 for detecting a phase difference 108 between system clock 105 and delayed clock 106, and a counter 104 generating a control signal 107 in response to phase difference 108 for enabling delay array 102 to determine how many delay elements should be used.

FIG. 1B shows the delay locking situation according to the prior delay locked loop. If the rising edge of delayed clock 106 falls within the safe delay locking range as shown, phase detector 103 will compare rising edges of system clock 105 and delayed clock 106 such that phase difference has a positive value when the rising edge of delayed clock 106 leads that of system clock 105, and has a negative value when the former is lagged beyond the latter. Counter 104 will adjust a delay time according to the value of phase difference 108 to provide control signal 107 for controlling delay device 102 to output appropriate delayed clock 106.

On the contrary, if the rising edge of delayed clock 106 does not fall within the shown safe delay locking range, phase difference 108 obtained through phase detector 103 cannot reflect the real situation so as to result in a system error. In other words, the rising edge of delayed clock 106 must be located within the shown safe delay locking range in order that the system can normally function. In addition, the initial output value of counter 104 must be properly selected to neatly cope with process deviation as well as temperature and voltage shifts for appropriate system operations in different frequencies. All these requirements cannot be duly met by the prior delay locked loop.

It is therefore tried by the applicant to deal with the above situation encountered by the prior art.

SUMMARY OF THE INVENTION

It is therefore an object of the present invention to provide a delay locked loop without the necessity of setting an initial delay.

It is further an object of the present invention to provide a delay locked loop having an expanded safe delay locking range.

It is still an object of the present invention to provide a delay locked loop having nothing to do with process deviation or temperature or voltage shift in operation.

According to a first aspect of the present invention, a delay locked loop to be supplied by a system clock includes a pulse generator receiving the system clock for generating a first pulse signal and a second pulse signal in response to a triggering signal, a delay device receiving the system clock for providing a delayed clock in response to a control signal, a frequency-reducing device electrically connected to the pulse generator for frequency-reducing the system clock into a first clock in response to the first pulse signal and frequency-reducing the delayed clock into a second clock in response to the second pulse signal, and a comparator electrically connected to the frequency-reducing device and the delay device for comparing the first and second clocks to generate the control signal.

Preferably the pulse generator includes a reset element receiving the system clock for generating two clock signals one of which is the second pulse signal, and a buffer electrically connected to the reset and the frequency-reducing device for receiving the other one of the two clock signals and generating the first pulse signal.

Certainly, the delay device can be a delay array. The reset element can be a D-type flip-flop. The buffer can include inverters of an even number. The first pulse signal can have a time delay when compared to the second pulse signal. The frequency-reducing device can be a frequency-dividing device.

Preferably the frequency-dividing device includes a first divider electrically connected to the pulse generator and the comparator for dividing the system clock to obtain the first clock in response to the first pulse signal, and a second divider electrically connected to the pulse generator and the comparator for dividing the delayed clock to obtain the second clock in response to the second pulse signal.

Certainly, the dividers can be of the same specification. They can be D-type flip-flops for dividing the respective clock by 2.

Preferably the comparator includes a phase detector electrically connected to the frequency-reducing device for detecting a phase difference between the first and second clocks, and a counter electrically connected to the phase detector and the delay device for generating the control signal in response to the phase difference.

Preferably the present delay locked loop further includes a clock generator for generating the system clock, and/or a trigger for providing the triggering signal.

In accordance with another aspect of the present invention, a delay locking method includes the following steps a) providing a system clock, a delayed clock and a triggering signal, b) converting the system clock into a first pulse signal and a second pulse signal in response to the triggering signal, c) respectively frequency-reducing the system clock and the delayed clock into a first clock and a second clock having a phase difference respectively in response to the first pulse signal and the second pulse signal, and d) adjusting a delay degree of the delayed clock according to the phase difference.

Preferably the present delay locking method further includes the following steps between the steps c) and d), i.e. c1) generating a control signal in response to the phase difference, and c2) adjusting the delay degree in response to the control signal.

Preferably the step b) further includes sub-steps of b1) converting the system clock into two clock signals one of which is the second pulse signal, and b2) converting the other one of the two clock signals into the first pulse signal.

Certainly, the other clock signal can be converted at a time delay after the system clock is converted. The step b) can be performed by a pulse generator. The step c) can be performed by two frequency dividers. The step d) can be performed by a delay device and a comparator having a phase detector and a counter.

In accordance with a further aspect of the present invention, a delay locked loop to be supplied by a system clock, a triggering signal and a delayed clock includes a pulse generator receiving the system clock for generating a first pulse signal and a second pulse signal in response to the triggering signal, and a frequency-reducing device electrically connected to the pulse generator for, respectively in response to the first pulse signal and the second pulse signal, respectively frequency-reducing the system clock and the delayed clock into a first clock and a second clock having a phase difference in response to which the delayed clock is delayed.

Preferably such delay locked loop further includes a comparator electrically connected to the frequency-reducing device for comparing the first and second clocks to obtain the phase difference for accordingly generating a control signal.

Preferably such delay locked loop further includes a delay device receiving the system clock for providing the delayed clock in response to the control signal.

Certainly, such delay locked loop can also further include a clock generator for generating the system clock and/or a trigger for providing the triggering signal.

The present invention may best be understood through the following descriptions with reference to the accompanying drawings, in which: dr

DETAILED DESCRIPTION OF THE PREFERRED EMBODIMENTS

Figure 1A:
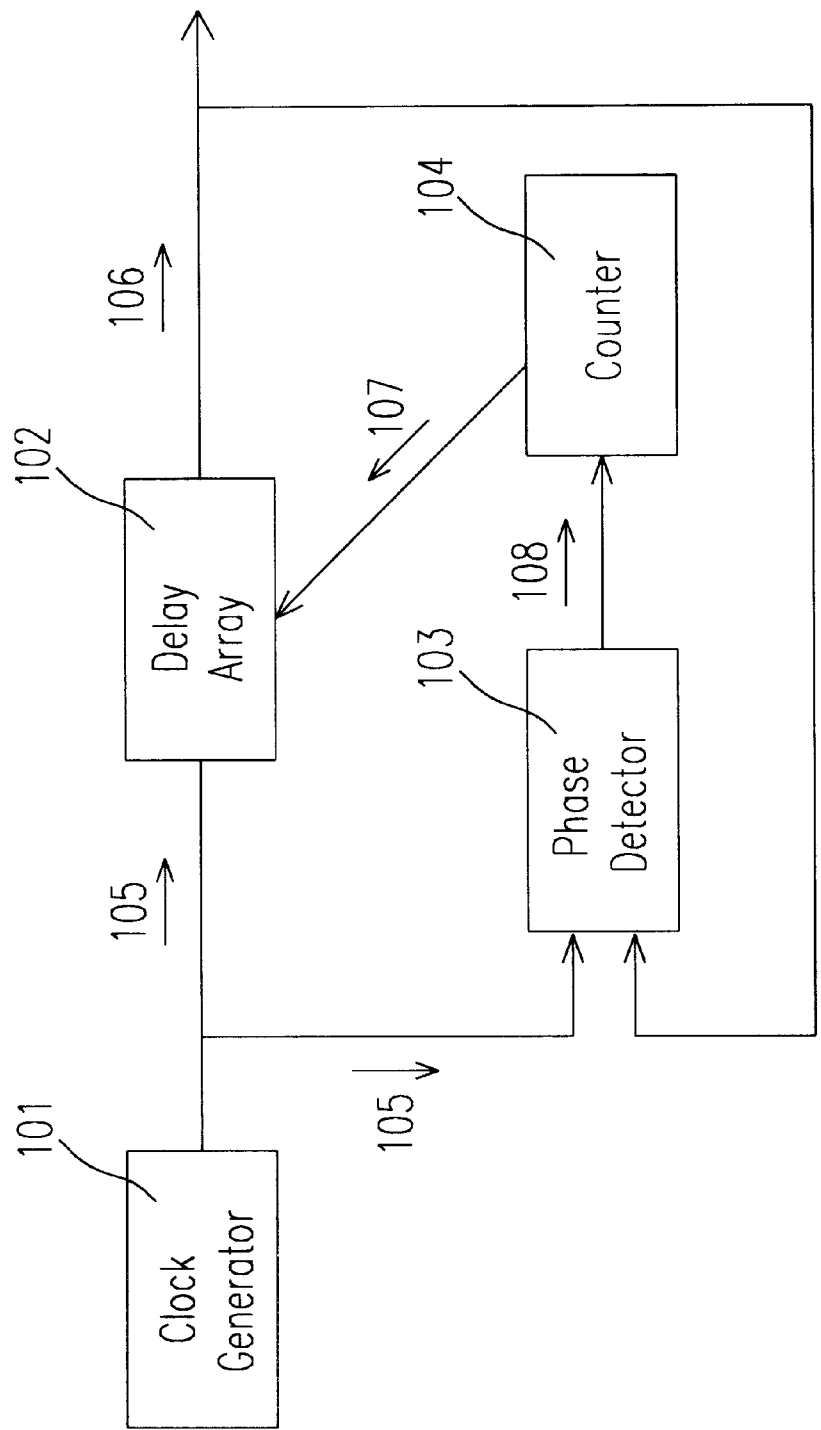
Fig. 1A is a block diagram showing a delay locked loop according to the prior art.
Figure 1B:
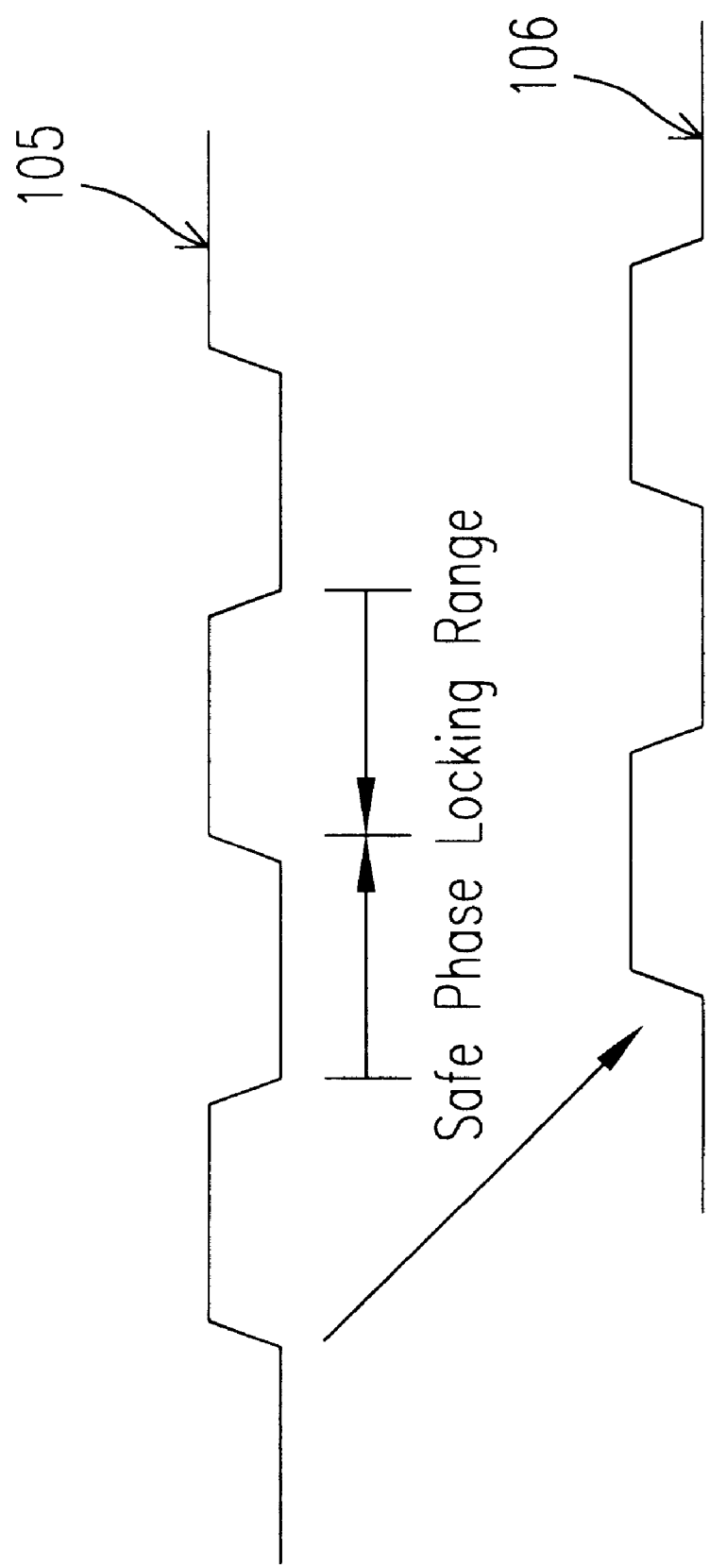
FIG. 1B is a schematical pulse diagram showing a relationship between the system clock and the delayed clock according to the prior delay locked loop.
Figure 2A:
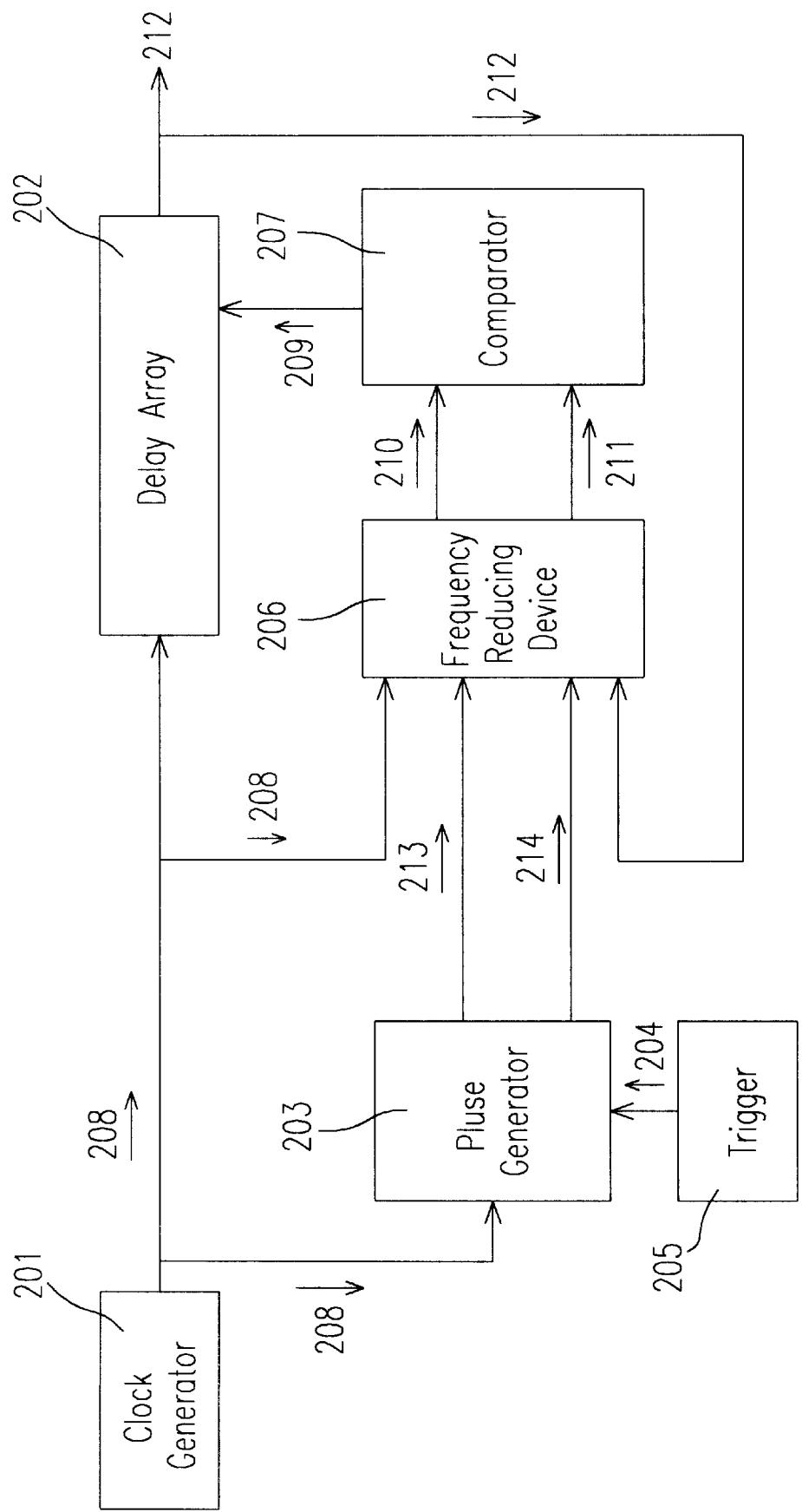
FIG. 2A is a block diagram showing a delay locked loop according to a preferred embodiment of the present invention.

Referring now to FIG. 2A, there is shown a preferred embodiment of a delay locked loop according to the present invention which includes a clock generator 201 for generating a system clock 208, a trigger 205 for providing a triggering signal 204, a pulse generator 203 receiving system clock 208 for generating a first pulse signal 213 and a second pulse signal 214 leading first pulse signal 213 in phase in response to triggering signal 204, a delay device 202 receiving system clock 208 for providing a delayed clock 212 in response to a control signal 209, a frequency-reducing device 206 electrically connected to pulse generator 203 for frequency-reducing system clock 208 into a first clock 210 in response to first pulse signal 213 and frequency-reducing delayed clock 212 into a second clock 211 in response to second pulse signal 214, and a comparator 207 electrically connected to frequency-reducing device 206 and delay device 202 for comparing first and second clocks 210, 211 to generate control signal 209 for controlling delay device 202 to determine how many delay elements should be used. Delay device 202 can be a clock delay array having therein a desired number of delay elements.

Figure 2B:
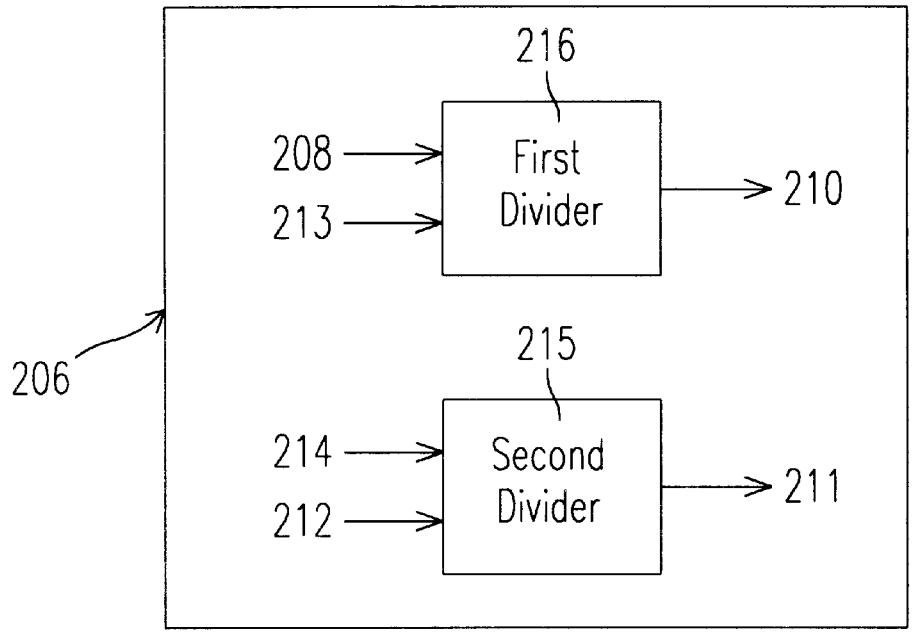
FIG. 2B is a block diagram showing a frequency-reducing device of a delay locked loop according to the present invention.

As complementarily shown in FIG. 2B, frequency-reducing device 206 can be a frequency-dividing device which includes a first divider 216 electrically connected to pulse generator 203 and comparator 207 for dividing system clock 208 to obtain first clock 210 in response to first pulse signal 213, and a second divider 215 electrically connected to pulse generator 203 and comparator 207 for dividing delayed clock 212 to obtain second clock 211 in response to second pulse signal 214. These dividers 215, 216 can be of the same specification, e.g. they can be D-type flip-flops for dividing the respective clock by 2.

Figure 2C:
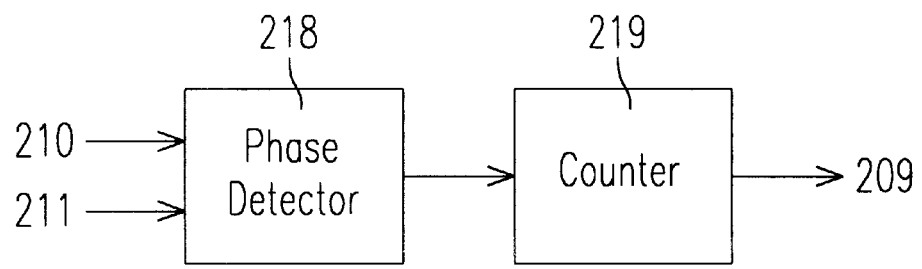
FIG. 2C is a block diagram showing a comparator of a delay locked loop according to the present invention.

As complementarily shown in FIG. 2C, comparator 207 can include a phase detector 218 electrically connected to frequency-reducing device 206 for detecting a phase difference 217 between first and second clocks 210, 211, and a counter 219 electrically connected to phase detector 218 and delay device 202 for generating control signal 209 in response to phase difference 217.

Figure 2D:
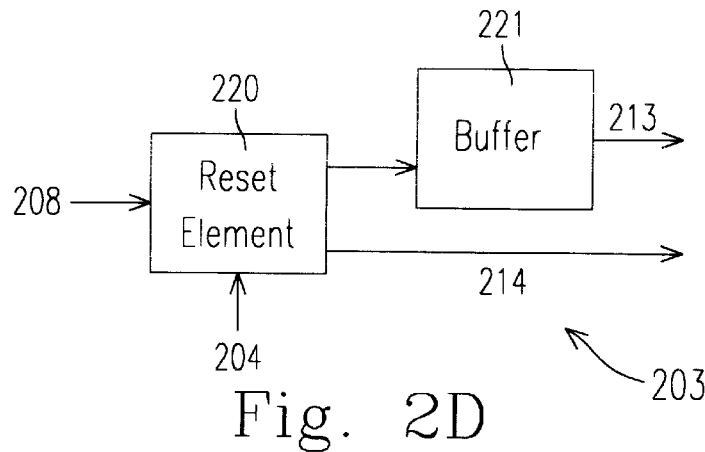
FIG. 2D is a block diagram showing a pulse generator of a delay locked loop according to the present invention.

As complementarily shown in FIG. 2d, pulse generator 203 includes a reset element 220 receiving system clock 208 for generating two clock signals one of which is second pulse signal 214, and a buffer 221 electrically connected to reset 220 and frequency-reducing device 206 for receiving the other one of the two clock signals and generating first pulse signal 213. Reset 220 can be a D-type flip-flop. Buffer 221 can include inverters of an even number. First pulse signal 213 in this particular instance has a time delay when compared to second pulse signal 214.

Figure 2E:
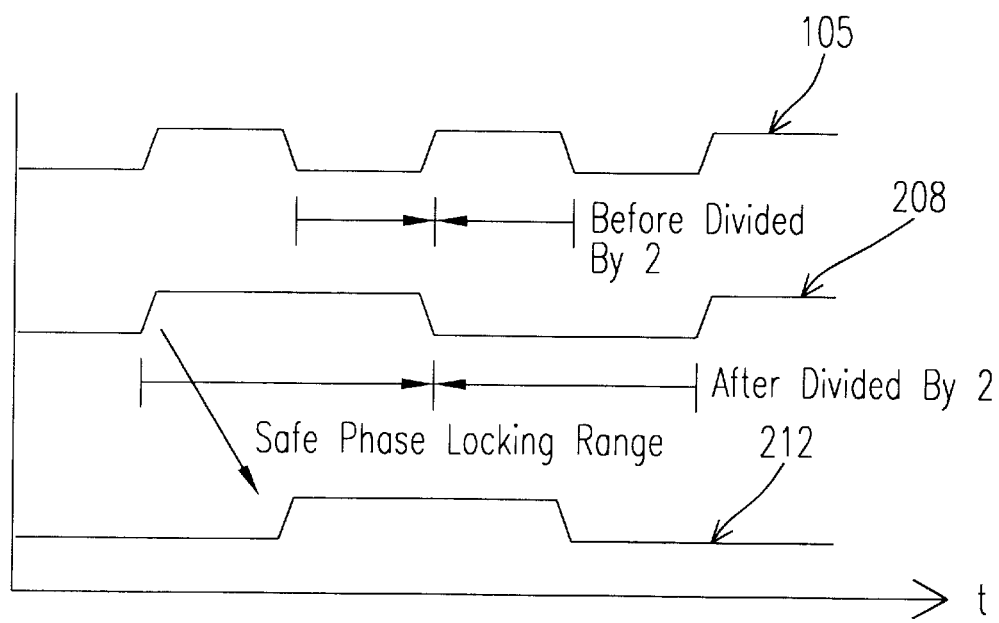
FIG. 2E is a schematical pulse diagram showing a relationship among the system clock according to the prior delay locked loop and the system clock and the delayed clock according to the present delay locked loop.

As shown in FIG. 2E which is a schematical pulse diagram showing a relationship among system clock 105 according to the prior delay locked loop and system clock 208 and delayed clock 212 according to the present delay locked loop. Through the provision of dividers 215, 216, the safe phase locking range for system clock 208 and delayed clock 212 is accordingly expanded. As a result, there is not a lower limit of the initial value for delay elements in delay device 202. In other words, a very small delay caused by the base delay in the system is enough so that a system according to the present invention can stand wonderfully unaffected by frequency change, process deviation and/or voltage fluctuation. Generally, a delay locked loop is to lock a system clock and a delayed clock in phase. The operation of phase detector 218 and counter 219 for determining the delay length should be completed before the next detection in order that the system can correctly function. For example, under 100 MHz operation, if the delayed clock leads the system clock 100 ps, a delay element can perform a 300 ps delay and through the operation of the comparator (103, 104), the delay time should be prolonged, the operated result will be that the delayed clock is lagged beyond the system clock by 200 ps. Accordingly, if the rectifying operation cannot be completed within 10 ns (i.e. one cycle), the delayed clock will still lead the system clock. Again, through the operation of the comparator (103, 104), the delay time is assumed to be further prolonged. As a result, the defined distance between the delayed clock and the system will become larger. That is to say, the circuit jitter will get bigger and can no more be desiredly controlled within ±300 ps.

Through the provision of frequency-reducing device 206 according to the present invention, the above error will be eliminated since the response time will be ample. Specifically, under 100 MHz operation, the response time will be increased to 20 ns if the used dividers are to divide by 2. Although the initial delay locking time is doubled at the same time, it plays no harm since it only totally costs 0.1 ms even at the circumstance that the initial delay locking operation is completed after 5,000 cycles. Accordingly, the low jitter function is obtained.

Figure 2F:
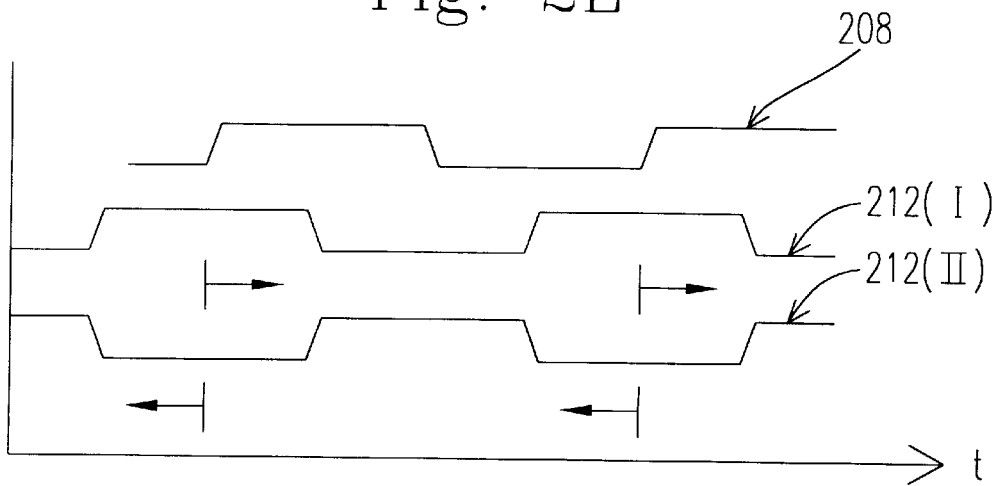
FIG. 2F is a schematical pulse diagram illustrating how the delay locking operation can be correctly or erroneously performed according to the present delay locked loop.

As shown in FIG. 2F which is a schematical pulse diagram illustrating how the delay locking operation can be correctly or erroneously performed according to the present delay locked loop. If delayed clock 212(I) is high in the rising edge of system clock 208, delayed clock 212(I) should be moved rightwardly as shown. On the contrary, if delayed clock 212(II) is low in the rising edge of system clock 208, delayed clock 212(II) should be moved leftwardly as shown. Speaking differently, if the initial states of delayed clock 212(I) and system clock 208 are both low, the arrows show the direction delayed clock 212(I) should be moved. If, however, the initial state of delayed clock (II) is high but that of system clock 208 is low, delayed clock 212(II) will be caused to move along the direction shown by the relevant arrows which will thus cause an error. Specifically, different high or low states will cause the phase to be locked in the opposite direction. Such error can be overcome by the provision of pulse generator 203.

Describing the principle of the present invention differently, a delay locking method includes the following steps:

a) providing a system clock 208, a delayed clock 212 and a triggering signal 204;

b) converting system clock 208 into a first pulse signal 213 and a second pulse signal 214 in response to triggering signal 204;

c) respectively frequency-reducing system clock 208 and delayed clock 212 into a first clock 210 and a second clock 211 having a phase difference 217 respectively in response to first pulse signal 213 and second pulse signal 214; and d) adjusting a delay degree of delayed clock 212 according to phase difference 217. Such delay locking method can further include the following steps between steps c) and d):

c1) generating a control signal 209 in response to phase difference 217; and c2) adjusting the delay degree in response to control signal 209. In such delay locking method, step b) can further include sub-steps of:

b1) converting system clock 208 into two clock signals one of which is second pulse signal 214; and b2) converting the other one of the two clock signals into first pulse signal 213.

In the disclosed embodiment, the other clock signal 214 is converted at a time delay after system clock 208 is converted. Step b) is performed by pulse generator 203. Step c) is performed by frequency dividers 215, 216. Step d) is performed by comparator 207 having a phase detector and a counter, and delay device 202.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What we claim is:

1. A delay locked loop adapted to be supplied by a system clock comprising:

a pulse generator receiving said system clock for generating a first pulse signal and a second pulse signal in response to a triggering signal;

a delay device receiving said system clock for providing a delayed clock in response to a control signal;

a frequency-reducing device electrically connected to said pulse generator for frequency-reducing said system clock into a first clock in response to said first pulse signal and frequency-reducing said delayed clock into a second clock in response to said second pulse signal; and a comparator electrically connected to said frequency-reducing device and said delay device for comparing said first and second clocks to generate said control signal.

2. A delay locked loop according to claim 1 wherein said delay device is a clock delay array.

3. A delay locked loop according to claim 1 wherein said pulse generator includes:

a reset element receiving said system clock for generating two clock signals one of which is said second pulse signal; and a buffer electrically connected to said reset and said frequency-reducing device for receiving the other one of said two clock signals and generating said first pulse signal.

4. A delay locked loop according to claim 3 wherein said reset is a D-type flip-flop.

5. A delay locked loop according to claim 3 wherein said buffer includes inverters of an even number.

6. A delay locked loop according to claim 3 wherein said first pulse signal has a time delay when compared to said second pulse signal.

7. A delay locked loop according to claim 1 wherein said frequency-reducing device is a frequency-dividing device.

8. A delay locked loop according to claim 7 wherein said frequency-dividing device includes:

a first divider electrically connected to said pulse generator and said comparator for dividing said system clock to obtain said first clock in response to said first pulse signal; and a second divider electrically connected to said pulse generator and said comparator for dividing said delayed clock to obtain said second clock in response to said second pulse signal.

9. A delay locked loop according to claim 8 wherein said dividers are of the same specification.

10. A delay locked loop according to claim 8 wherein said dividers are D-type flip-flops for dividing the respective clock by 2.

11. A delay locked loop according to claim 1 wherein said comparator includes:

a phase detector electrically connected to said frequency-reducing device for detecting a phase difference between said first and second clocks; and a counter electrically connected to said phase detector and said delay device for generating said control signal in response to said phase difference.

12. A delay locked loop according to claim 1, further comprising a clock generator for generating said system clock.

13. A delay locked loop according to claim 1, further comprising a trigger for providing said triggering signal.

14. A delay locking method comprising the following steps:
   a) providing a system clock, a delayed clock and a triggering signal;
   b) converting said system clock into a first pulse signal and a second pulse signal in response to said triggering signal;
   c) respectively frequency-reducing said system clock and said delayed clock into a first clock and a second clock having a phase difference respectively in response to said first pulse signal and said second pulse signal; and
   d) adjusting a delay degree of said delayed clock according to said phase difference.

15. A delay locking method according to claim 14, further comprising the following steps between said steps c) and d):
   c1) generating a control signal in response to said phase difference; and
   c2) adjusting said delay degree in response to said control signal.

16. A delay locking method according to claim 15 wherein said step b) further includes sub-steps of:
   b1) converting said system clock into two clock signals one of which is said second pulse signal; and
   b2) converting the other one of said two clock signals into said first pulse signal.

17. A delay locking method according to claim 16 wherein said the other clock signal is converted at a time delay after said system clock is converted.

18. A delay locking method according to claim 14 wherein said step b) is performed by a pulse generator.

19. A delay locking method according to claim 14 wherein said step c) is performed by two frequency dividers.

20. A delay locking method according to claim 14 wherein said step d) is performed by a comparator and a delay device.

21. A delay locking method according to claim 20 wherein said comparator includes a phase detector and a counter.

22. A delay locked loop adapted to be supplied by a system clock, a triggering signal and a delayed clock comprising:
   a pulse generator receiving said system clock for generating a first pulse signal and a second pulse signal in response to said triggering signal; and
   a frequency-reducing device electrically connected to said pulse generator for, respectively in response to said first pulse signal and said second pulse signal, respectively frequency-reducing said system clock and said delayed clock into a first clock and a second clock having a phase difference in response to which said delayed clock is delayed.

23. A delay locked loop according to claim 22, further comprising a comparator electrically connected to said frequency-reducing device for comparing said first and second clocks to obtain said phase difference for accordingly generating a control signal.

24. A delay locked loop according to claim 23, further comprising a delay device receiving said system clock for providing said delayed clock in response to said control signal.

25. A delay locked loop according to claim 22, further comprising a clock generator for generating said system clock and a trigger for providing said triggering signal.

* * * * *